United States Patent [19]

Adam et al.

[11] 4,193,822

[45] Mar. 18, 1980

[54] HIGH STRENGTH ALUMINIUM BASE ALLOYS

[75] Inventors: Colin M. Adam, Camp Hill; Clive G. Bennett, East Doncaster, both of Australia

[73] Assignee: Comalco Aluminium (Bellbay) Limited, Tasmania, Australia

[21] Appl. No.: 922,640

[22] Filed: Jul. 7, 1978

[30] Foreign Application Priority Data

Jul. 15, 1977 [AU] Australia .............................. PD 0865

[51] Int. Cl.² .............................................. C22F 1/04
[52] U.S. Cl. ......................................... 148/3; 75/138; 75/141; 75/146; 148/32.5; 148/159
[58] Field of Search ................. 75/138, 139, 141, 142, 75/146, 147; 148/32, 32.5, 3, 159

[56] References Cited

U.S. PATENT DOCUMENTS 4,002,502   1/1977   Bainbridge et al. .................. 75/138

Primary Examiner—R. Dean
Attorney, Agent, or Firm—Larson, Taylor and Hinds

[57] ABSTRACT

The present invention relates to aluminium base alloys consisting essentially of aluminium, about 0.5 to 5% iron and at least one element selected from magnesium, copper, zinc and manganese. The alloys of the present invention contain cells of Al—$Al_6Fe$ eutectic, whereas the $Al_6Fe$ phase is present in the form of fibres, in combination with precipitates due to precipitation hardening.

6 Claims, 2 Drawing Figures

HIGH STRENGTH ALUMINIUM BASE ALLOYS

This invention relates to aluminium base alloys.

The alloys according to this invention exhibit improved stiffness and strength. This is achieved by combination of the stiffening effect of in-situ grown eutectic fibre reinforcement, and the strengthening effect of precipitation hardening.

The metallurgical microstructure including said fibre reinforcement is provided by the addition of iron in amounts ranging from 0.5–5% by weight, together with careful control of the solidification conditions to produce cells of Al-Al$_6$Fe eutectic, wherein the Al$_6$Fe phase is present in the form of fibres.

Capacity for precipitation hardening is imparted by the addition of some or all of the elements—magnesium, copper, zinc and manganese, to the alloys.

In our Australian Pat. No. 468,234 and our U.S. Pat. No. 4,002,502 we have described aluminium base alloys of novel metallurgical microstructure exhibiting superior mechanical properties, the microstructure being achieved by control of certain parameters as more fully discussed therein.

As in the abovementioned patents, control of casting conditions in the present case is an important factor in achieving formation of the desired Al-Al$_6$ Fe eutectic, which is also influenced by the composition of the alloy. The general control parameters are:

(a) The temperature gradient existing between the solid and liquid metal during casting, commonly referred to as G, expressed as degrees Celsius per millimeter.
(b) The growth rate of the alloy phases as they solidify, i.e., the growth velocity of the solid-liquid interface, commonly referred to as R, expressed in microns per second.

Means for the control of the temperature gradient G and growth rate R include controlling the temperature, rate of pouring of the molten metal, geometry of the moulds and selecting mould materials possessing particular thermal conductivities.

In one aspect of the present invention, aluminium alloys are provided of the following compositions:

| Elements | % |
| --- | --- |
| Fe | 0.5–5.0, preferably 2.5–3.2% |
| Cu | 0.0–3.0 |
| Mn | 0.0–1.0 |
| Mg | 0.1–6.0 |
| Zn | 0.5–10 |
| Al | Remainder, apart from impurities. |

A particularly preferred composition contains:

| | |
| --- | --- |
| Fe | 2.8 |
| Cu | 2.0 |
| Mn | 0.3 |
| Mg | 2.6 |
| Zn | 7.3 |

For the alloys of this invention, preferred values of G are from 1° Celsius to 20° Celsius per millimeter, and preferred values of R are from 500 microns per second to 2000 microns per second.

The incorporation of the stiff Al$_6$Fe fibres into the alloys of the present invention increases both their elastic modulus and their yield strength. The alloys are intended for use in cast, as well as wrought forms. In the former, the fibres are longer, and in the latter, broken and shorter.

As indicated above, the alloys of the present invention are also improved by precipitation hardening.

When alloying elements for precipitation hardening are added to aluminium iron alloys, requirements pertinent to Al$_6$Fe formation, additional to those stated in our abovementioned patents, exist.

Each alloying element added affects the eutectic reaction, more specifically, the stability of the Al$_6$Fe phase. The effects of the various alloying elements which are relevant to this invention are shown in Table 1 below.

Table 1

| | Al$_6$Fe Stability |
| --- | --- |
| Element | Effect on Al$_6$Fe Stability |
| Copper | Slight Stabilisation |
| Zinc | Neutral Stability |
| Manganese | Slight Stabilisation |
| Magnesium | Strong Destabilisation |

There is evidence in the technical literature that successful precipitation hardening has been carried out in eutectic Al-Cu alloys. In this, as in any binary system, the precipitate particles are the same phase as one of the constituent phases of the eutectic (see C. G. Rhodes and G. Garmong, Met. Trans., Vol. 3, July 1972, pp. 1861–1868).

In ternary, or more complex alloys such as those described in this specification, it is possible, indeed likely, that there will be precipitates which are different from the fibrous eutectic phase (Al$_6$Fe), e.g. MgZn$_{11}$, MgZn$_2$.

The choice of alloying elements other than iron is, therefore, influenced by two sets of factors, viz., (a) The tendency of copper and manganese to form compounds with iron which are isostructural with Al$_6$Fe, e.g. Al$_6$(Fe,Cu), Al$_6$Mn and Al$_6$(Fe,Mn) and which are considered to stabilise the Al$_6$Fe compound of the eutectic. (See H. L. Phillips, Inst. of Metals Monograph No. 25, London 1959, pp. 48–52).
(b) The tendency of zinc and magnesium to form suitable binary compounds with each other, e.g. MgZn$_{11}$, MgZn$_2$. As already indicated in Table 1, zinc is considered to have no effect on the Al$_6$Fe stability whereas magnesium is strongly de-stabilising.

For a better understanding of the microstructure of the alloys described, reference is made to the following illustrations wherein.

Figure 1:
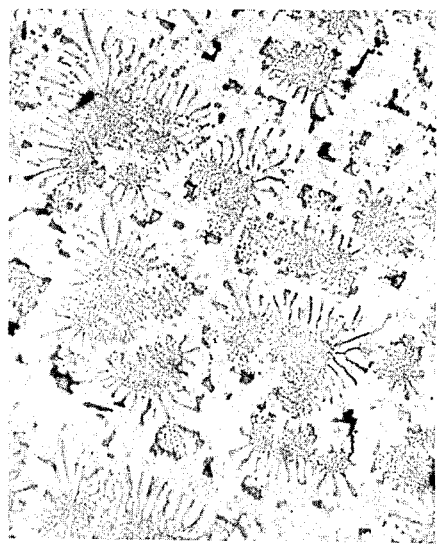
FIG. 1 is a photo-micrograph at a magnification of × 600 showing a typical cellular Al$_6$Fe eutectic microstructure.
Figure 2:
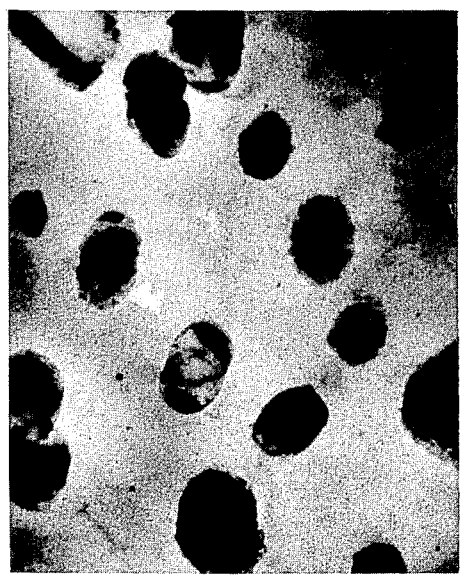
FIG. 2 is a transmission electron micrograph at a magnification of × 10,000 of the same alloy shown in FIG. 1 taken in a transverse direction to the growth axis and showing Al$_6$ Fe fibres in a precipitation hardened matrix.

The chemical composition of the alloy shown is the particularly preferred composition.

By way of example, the mechanical properties of a typical alloy containing 2.8% iron, 7.3% Zn, 2.6% Mg, 2.0% Cu and 0.30% Mn heat treated to peak strength conditions are shown in Table 2. The values shown are average values from multiple test pieces. This alloy combines an elastic modulus some 10% higher than commercial purity aluminium with high yield and ultimate strengths. The alloy was unidirectionally solidified at 1500 microns per second. The temperature gradient was 5° C. per millimeter.

Table 2

| Mechanical Properties | | |
|---|---|---|
| 0.2% Proof Yield Stress Mpa | 510 | (74,000 psi) |
| Ultimate Tensile Strength Mpa | 633 | (92,000 psi) |
| Plastic Modulus GPz | 78 | (11.3 × 10$^6$ psi) |
| Elongation | 7 | |

Table 3 shows typical peak hardness values of a cast alloy in accordance with this invention together with peak hardness values of one cast and of some wrought commercial alloys of similar chemical composition.

Table 3

| Hardness | |
|---|---|
| Composition Alloy & Condition | Peak Hardness VPHN |
| Our Alloy- 2.8 Fe, 7.3 Zn, 2.6 Mg, 2.0 Cu, 0.3 Mn Unidirectionally solidified at R = 1500 μ/Sec | |
| (a) Preaged 1 hour at 100° C. aged 2 hours at 150° C. | 227 |
| (b) Aged 2 hours at 150° C. | 220 |
| Experimental cast Al-Mg-Zn alloy 8.0 Zn, 2.0 Mg in peak aged condition | 164 |
| 7000 series wrought alloys in peak aged condition | |
| 7001 Series | 191 |
| 7075 Series | 174 |
| 7079 Series | 169 |

FIG. 3 depicts the graphs which form the basis for Table 3.

We claim:

1. An aluminum base alloy consisting essentially of aluminum, about 0.5 to 5% iron, about 0.1 to 6.0% magnesium, about 0.0 to 3.0% copper, about 0.5 to 10% zinc and about 0.0 to 1.0 percent manganese, the metallurgical microstructure of the said alloy consisting essentially of cells of Al-Al$_6$Fe eutectic, wherein the Al$_6$Fe phase is present in the form of fibers, in combination with precipitates due to precipitation hardening.

2. An aluminum base alloy as claimed in claim 1, containing about 2.5 to 3.2% iron.

3. An aluminum base alloy as claimed in claim 2, consisting essentially of about 2.8% iron, about 2.6% magnesium, about 2.0% copper, about 7.3% zinc and about 0.3% manganese.

4. In a method of casting aluminum-iron alloy from a melt with a controlled temperature gradient between the solid and liquid metal and with a controlled rate of growth of the alloy phases as they solidify, said alloy consisting essentially of aluminum and about 0.5 to 5% by weight of iron, the improvement which comprises providing in said melt about 0.1 to 6.0% magnesium, about 0.0 to 3.0% copper, about 0.5 to 10% zinc and about 0.0 to 1.0% manganese, to improve the stiffness and strength of said alloy by producing in said alloy the metallurgical microstructure consisting essentially of cells of Al-Al$_6$Fe eutectic, wherein the Al$_6$Fe phase is present in the form of fibers, in combination with precipitates due to precipitation hardening.

5. A method according to claim 4, wherein the temperature gradient is controlled to be within the range of about 1° C. to 20° C. per millimeter.

6. A method according to claim 4, wherein the growth rate of the alloy phases are controlled to be within the range of about 500 microns to 2000 microns per second.

* * * * *